United States Patent [19]
Kao

[11] Patent Number: 5,785,042
[45] Date of Patent: Jul. 28, 1998

[54] MAGNETIC RESONANCE IMAGING METHOD PROVIDING FOR CORRECTION OF STRIATION ARTIFACTS

[75] Inventor: Yi-Hsuan Kao, Durham, N.C.

[73] Assignee: Duke University, Durham, N.C.

[21] Appl. No.: 388,614

[22] Filed: Feb. 14, 1995

[51] Int. Cl.$^6$ .................................................. A61B 5/055
[52] U.S. Cl. ...................................... 128/653.2; 324/309
[58] Field of Search ..................... 128/653.2; 324/307, 324/309; 364/413.19, 413.2; 378/62, 63; 382/128, 131, 132

[56] References Cited

U.S. PATENT DOCUMENTS

| | | | |
|---|---|---|---|
| 4,672,320 | 6/1987 | Sekihara et al. | 324/309 |
| 4,739,766 | 4/1988 | Riederer | 128/653 |
| 4,830,012 | 5/1989 | Riederer | 128/653 |
| 4,901,335 | 2/1990 | Ferlic et al. | 378/37 |
| 4,912,413 | 3/1990 | DeMeester et al. | 324/312 |
| 5,138,259 | 8/1992 | Schmitt et al. | 324/309 |
| 5,168,227 | 12/1992 | Foo et al. | 324/309 |
| 5,204,627 | 4/1993 | Mistretta et al. | 324/309 |
| 5,262,725 | 11/1993 | Cuppen et al. | 324/309 |

OTHER PUBLICATIONS

Foo et al., *IEEE Transactions on Medical Imaging*, "SNORE: Spike Noise Removal and Detection" vol. 13, No. 1, pp. 133–136 (Mar. 1994).

Spraggins, *Book of Absracts*, "Spike Removal from MR Raw Data Sets" vol. 2, p. 789, Society of Magnetic Resonance in Medicine (Aug. 1987).

Sanz et al., 1992 *SMRI Annual Meeting Printed Program*, "Extraction of Noise Spikes in MR Imaging", p. 91 (Mar./Apr. 1992).

Henkleman et al., "Artifacts in Magnetic Resonance Imaging", *Review of Magnetic Resonance in Medicine*, vol. 2, No. 1, pp. 32–34 (1987).

Henkleman, "Image Artifacts", *Magnetic Resonance Imaging*, vol. 1, Chpt. 10, pp. 233, 242 and 243 (1992).

Korosec, et al. A Data Adaptive Reprojection Technique for MR Angiography: *Magnetic Resonance in Medicine*, vol. 2, pp. 262–274 (1992).

Rosenfeld et al., "Compression", *Digital Picture Processing*, vol. 1, Chpt. 5, pp. 116, 117, 127, 150 and 151 (1982).

Eddy, "The MPEG Compression Algorithm", *PC Graphics & Video*, pp. 52–55 (1994).

Gonzalez et al., "Image Transforms", *Digital Image Processing*, Chpt. 3, pp. 81–111, 143, 144, 389, 394–396, 404 and 405 (1993).

Riederer, "Spacial Encoding and Image Reconstruction", *Medical Physics Monograph No. 21*, pp. 135–165 (1992).

Lauterbur, "Image Formation by Induced Local Interactions: Examples Employing Nuclear Magnetic Resonance", *Nature*, vol. 242, pp. 190, 191 (1973).

Edelstein, et al. "Spin Warp NMR Imaging and Applications to Human Whole–Body Imaging.", *Phys. Med. Biol*, vol. 25, No. 4, pp. 751–756 (1980).

Peters, "An Introduction To k–Space", *Medical Physics Monograph No. 21*, pp. 754–770 (1992).

Harris, "On the Use of Windows for Harmonic Analysis With the Discrete Fourier Transform", *Proceedings of the IEEE*, vol. 66, No. 1, pp. 51–83 (1978).

(List continued on next page.)

*Primary Examiner*—Marvin M. Lateef
*Assistant Examiner*—Brian L. Casler
*Attorney, Agent, or Firm*—Richard E. Jenkins, P.A.

[57] ABSTRACT

A method for correcting striation artifacts that are generated during a magnetic resonance imaging method. The method involves generating an image of a body area. The image is reconstructed from raw data collected in a spatial-frequency domain. As some of the data points in the raw data from which the image is generated are corrupted, the image of the body area contains striation artifacts. A region containing a homogenous material is selected. Next, the corrupted data points in the raw data are detected and corrected vis-a-vis a Fourier transform correction process, and a new corrected image essentially free of striation artifacts is generated.

21 Claims, 14 Drawing Sheets

OTHER PUBLICATIONS

Keller, *Basic Principles of Magnetic Resonance Imaging*, pp. 1–29 (1988).

Matwiyoff, "Instrumentation", *Magnetic Resonance Imaging*, 2nd Ed., vol. 1, Chpt. 3, pp. 67–87 (1992).

Mitchell et al., "The Use of Band–Selectable Digital Filtering in Magnetic Resonance Image Enhancement", *Magnetic Resonance in Medicine* vol. 9, pp. 353–358 (1989).

Smith, et al., "Efficient Algorithms for Generating Interpolated (Zoomed) MR Images", *Magnetic Resonance in Medicine*, vol. 7, pp. 156–171 (1988).

FIG. I

MAGNETIC RESONANCE IMAGING METHOD PROVIDING FOR CORRECTION OF STRIATION ARTIFACTS

TECHNICAL FIELD

The present invention relates generally to a method for producing images of the interior of a body, usually a living body, using data derived from magnetic resonance imaging (hereinafter, abbreviated as MRI) measurement techniques, and more particularly to an improved imaging method and the related image, wherein the resultant image is essentially free from striation artifacts that are sometimes produced during MRI.

BACKGROUND OF THE INVENTION

The particular details of MRI imager hardware and software will be dictated by the details of different imaging techniques. Nevertheless, regardless of the particular imaging techniques employed, the major components of MRI hardware and software are common to all techniques, and are well known to those ordinarily skilled in the art of MRI.

More specifically, these components are: first, that a magnet imposes a strong, uniform magnetic field in order to obtain an image from a selected body area (which may be the whole body or various portions thereof); second, that this strong magnetic field is modulated by gradient coils; third, that a transmitter delivers a radio-frequency magnetic field through a coil or coils in order to induce resonance, whereby the body (i.e., the protons in the nuclei in the atoms in the body area) produce MRI signals, and the coil(s) gather the MRI signals. Concurrently, a receiver, connected to the coil, delivers suitably amplified signals to an analogue-to-digital convertor. Fourth, a computer controls, acquires data, stores data in its memory, processes, and displays a MR image of the body area on a screen, which image may be a still or a video. Thus, the image is a picture displayed on the screen. Conveniently, the computer is connected to a printer also to provide a printout or a video film of the image of the body area.

MRI has experienced increasing acceptance in recent years as a diagnostic tool for producing images of the interior areas of various bodies, i.e., animal or human bodies, but particularly a living, human body. MR diagnostic medical imaging is especially attractive since it does not cause a patient to be exposed to the potentially hazardous x-rays utilized in most prior art imaging technology. Accordingly, a common clinical use of MRI is to generate an image from a chosen area in a subject (usually an alive human), followed by the image being analyzed/diagnosed to determine problems, if any, with the subjects's tissue volume and/or blood flow, etc.

In clinical MRI, a human body is placed inside of a static magnetic field (about 1 tesla) along, for example, the z-axis of a three-dimensional Cartesian coordinate system. All the spins of, for example, the protons in the nuclei will be either parallel to or processing around the z-axis at the same angular velocity, and the angular velocity of the spins is proportional to the static magnetic field.

When a spatial-varying magnetic field (about $10^{-4}$ tesla/cm) is added for imaging, the spins at different locations are processing at different angular velocities according to the net magnetic field at their locations. The components of the processing spins on the x-y plane can be detected via magnetic induction using two coils that are perpendicular to each other on the x-y plane.

The detected signal is the collective signal of the components of all processing spins on the x-y plane. By adjusting the time intervals that the spatial-varying magnetic gradients are applied, the detected signal can represent the spatial-frequency function of the components of the processing spins at different locations of the human body. Thus, the detected raw data are collected in a spatial-frequency domain (also called a "k-space" domain), and an MRI scanner can reconstruct images from the k-space raw data using either a discrete Fourier transform method or a back-projection method, depending on the imaging method employed.

However, occasional errors can occur during either the collecting or the digitizing processes, resulting in corrupted data points in the k-space raw data. Thus, the images generated by the MRI scanner from the corrupted k-space raw data have striation artifacts, and hence the image quality is degraded. The striation artifacts affect visual diagnosis and quantitative measurements of the images and therefore can cause misinterpretation. Also, the striation artifacts may necessitate an extra MRI scan, hopefully to obtain an image that has no or fewer striation artifacts, thereby often causing extra scan time during which the patient must hold still.

Although the probability for corrupted data points is very small, the total number of images with striation artifacts is noticeable because of the huge number of operations involved. As a result, the total number of images with striation artifacts generated from a scanner over a long time, such as a year, can be of consequence.

Although there is no entirely satisfactory way in the current state of the art in MRI to prevent or correct these corrupted data points, the following articles and patents are of interest.

Henkelman and Bronskill, "Artifacts in Magnetic Resonance Imaging" *Review of Magnetic Resonance in Medicine*, Vol. 2, No. 1, pp. 1–126, at pp. 32–34, (1987), and Henkelman, "Image Artifacts" *Magnetic Resonance Imaging*, D. D. Stark and W. G. Bradley (Editors), 2nd edition, Vol. 1, Chp. 10 (which begins on p. 233), at pp. 242 and 243 (1992), indicate that the corrupted data points can be identified by inspection or software tools under the operator's control, and the erroneous data causing striation artifacts can be replaced by an interpolated estimate using the signal average of neighboring data points.

Lauterbur, "Image Formation by Induced Local Interactions: Examples Employing Nuclear Magnetic Resonance" *Nature*, Vol. 242, pp. 190, 191 (Mar. 16, 1973), describes how an image of an object may be defined as a graphical representation of the spacial distribution of one or more of its properties.

Edelstein, Hutchison, Johnson, and Redpath, "Spin Warp NMR Imaging and Applications to Human Whole-Body Imaging" *Phys. Med. Biol.*, Vol. 25, No. 4, pp. 751–756 (1980), describe the magnet and pulse sequence employed for the then novel imaging technique called spin warp imaging.

Riederer, "Spacial Encoding and Image Reconstruction" *Medical Physics Monograph No. 21*, (*The Physics of MRI*), 1992 *AAPM Summer School Proceedings*, published for the American Association of Physicists in Medicine by the American Institute of Physics, pp. 135–165 (Aug. 30–Sep. 4, 1992), describes the manner in which the transverse magnetization is determined for each point within the object of interest so that encoding and image reconstruction can be accomplished with nuclear magnetic resonance (hereinafter, abbreviated as "NMR", which is another term for magnetic resonance imaging).

Peters, "An Introduction To k-Space" *Medical Physics Monograph, No. 21, The Physics of MRI* (1992 AAPM

*Summer School Proceedings)*, published for the American Association of Physicists in Medicine by the American Institute of Physics, pp. 754–770 (Aug. 30–Sep. 4, 1992), describes background information involving 2-dimensional Fourier transforms and k-space in the context of magnetic resonance imaging.

Harris, "On the Use of Windows for Harmonic Analysis with the Discrete Fourier Transform" *Proceedings of the IEEE*, Vol. 66, No. 1 (January, 1978) affords a concise review of data windows and their effect on the detection of harmonic symbols in the presence of broad-band noise.

Mitchell, Nichols, Smith, and Scott, in a publication entitled "The Use of Band-Selectible Digital Filtering in Magnetic Resonance Image Enhancement" in *Magnetic Resonance in Medicine*, Vol. 9, pp. 353–369 (1989), disclose that manipulation of the data describing 2-dimensional magnetic resonance images can be used to zoom an image, decrease image noise and artifacts by modeling, or emphasize object edges in the field of view.

Additionally, Smith and Nichols, in a publication entitled "Efficient Algorithms for Generating Interpolated (Zoomed) MR Images" in *Magnetic Resonance in Medicine*, Vol. 7, pp. 156–171 (1988) disclose that the 2-dimensional implementation of a number of modified fast Fourier transform algorithms efficiently interpolate (i.e., zoom) magnetic resonance images.

Lastly, it is noted that general background information for MR instrumentation can be seen in Keller, *Basic Principles of Magnetic Resonance Imaging*, published for the Department of Magnetic Resonance Research Barrow Neurological Institute of St. Joseph's Hospital and Medical Center, Phoenix, Ariz., pp. 1–29 (1988) and in Matwiyoff, "Instrumentation" *Magnetic Resonance Imaging*, D. D. Stark and W. G. Bradley (Editors), 2nd edition, Vol. 1, Chp. 3, at pp. 67–87 (1992).

The technology reviewed in the above-mentioned various articles is well known today to the person of ordinary skill in the art of MRI, and thus, all the disclosures thereof are incorporated herein by reference. As can be seen from a review of these articles, it would be desirable to generate MR images essentially free of striation artifacts, which has been unexpectedly and surprisingly achieved with the present invention.

OBJECTS AND SUMMARY OF THE INVENTION

The present invention provides a method for correcting striation artifacts generated in a magnetic resonance imaging method. The inventive method comprises generating and storing in a computer memory (i) complex raw data, namely raw data that have both real components and imaginary components, and (ii) a first image of a selected body area. The raw data are collected in a spatial-frequency domain of the first image of the selected body area. Also, the first image is reconstructed from the raw data. Furthermore, the raw data include corrupted data points such that the first image has striation artifacts thereon.

A region that contains a homogenous material is selected. The homogenous material region has real components and imaginary components, which are communicated to the computer memory for correction. Then, the method involves subjecting the real and imaginary components of the homogenous material region to a Fourier transform detection process. As a result, the corrupted data points in the raw data are detected. Next, the detected corrupted data points are communicated to the computer memory and stored therein.

Lastly, the method involves subjecting the detected corrupted data points to a Fourier transform correction process to remove striation artifacts, and generating from the computer memory a corrected second image essentially free of striation artifacts.

Preferably, the method further includes applying a data window, such as a Hanning-window filter, to choose the region containing a homogenous material. As described in more detail below, the window may be applied on the image domain of the body area (which is related by a discrete fourier transform to the spatial-frequency domain of the body area) or on the intermediate domain (which is located between the spatial-frequency domain and the image domain). Also, the inventive method may include performing the correction process in the spatial-frequency domain, the image domain, the intermediate domain, or a combination thereof. Information in the domains may be added or subtracted, to produce a sum or a difference, and the corrected second image is generated from the sum or the difference, as further described below.

Hence, it is an object of the invention to provide a magnetic resonance imaging method that will provide an image of a body area, and the image will be essentially free of striation artifacts such that a subject, such as a living patient, vis-a-vis a MR image of the subject may, be more consistently analyzed/diagnosed correctly.

Accordingly, it is an advantage of the invention that no extra MRI scan of the patient is needed, whereby extra scan time is avoided and the only extra time is a few seconds for the inventive method to occur.

Avoidance of extra scan time is an important feature of the invention, as scan time is the time during which the patient needs to be held stationary in a confined environment.

It is another feature of the present invention that it can be implemented with any prior art MR apparatus or method.

Some of the objects, advantages, and features of the invention having been stated above, others will become evident as the description proceeds, when taken in connection with the accompanying drawings as best described below.

DEFINITIONS

Figure 1:
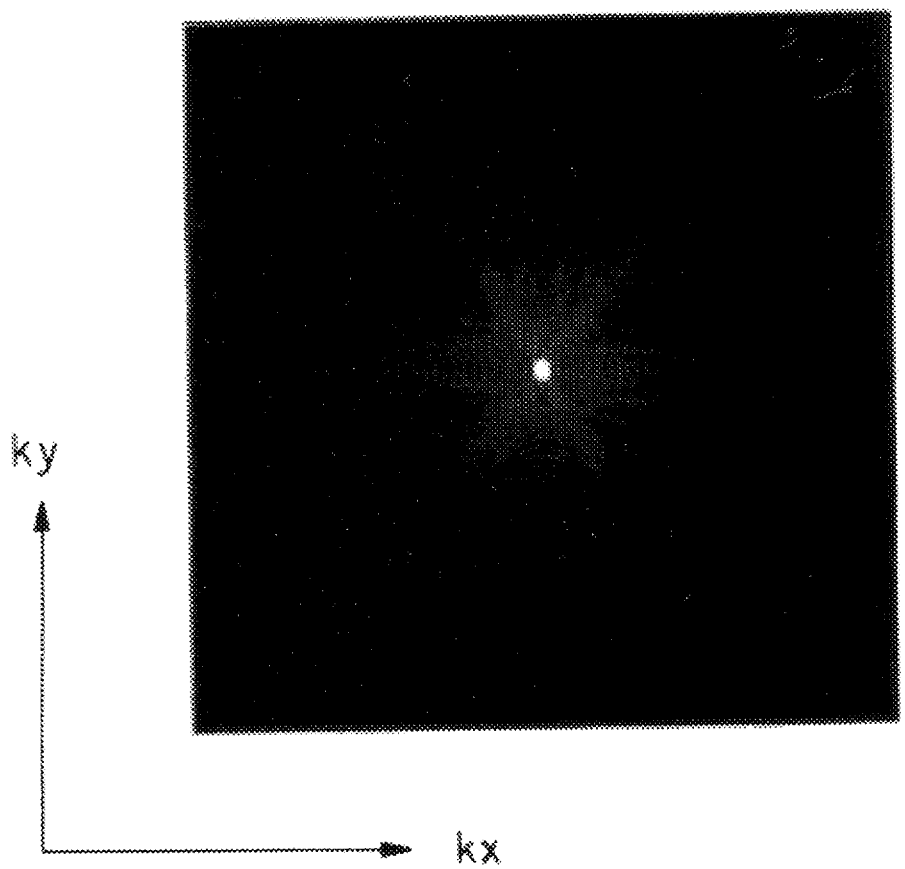
FIG. 1 illustrates the magnitude of k-space raw data with the low-spatial-frequency data located at the middle of the two-dimensional k-space domain.

As noted above, with current commercial MRI techniques, there is a small probability for striation artifacts in the MR image. By the term "essentially free of striation artifacts", as used herein in connection with the present invention, is meant that the probability for striation artifacts in the MR image is greatly reduced, as compared with current commercial MRI techniques, although the present invention cannot completely eliminate striation artifacts and an extremely small percentage of MR images having striation artifacts still exists even with the present invention.

Various mathematical equations are described in the "Detailed Description" section below, with each equation being designated with a numeral when it is first introduced. For convenience, the numerals are employed throughout the remainder of the specification.

Additionally, the following designations have been employed in the detailed description below:

| | |
|---|---|
| one-dimensional | 1D |
| two-dimensional | 2D |
| magnetic resonance imaging | MRI |
| discrete Fourier transform | DFT |
| spatial-frequency domain | k-space domain |
| homogenous material region | a region that is chosen from at least one of a background area in the image domain, a homogenous tissue area in the image domain, or an area containing random noise in the intermediate domain |
| image | picture of a body area displayed on a screen |

DETAILED DESCRIPTION OF THE INVENTION AND FIGURES

In general, the present invention relates to a method using an algorithm in magnetic resonance imaging in order to correct corrupted data points in the raw data that cause the image produced by an MRI scanner to have striation artifacts. The invention may be a one-dimensional, a 2-dimensional, or a multi-dimensional Fourier transform detection and correction method.

More specifically, for any MR method and apparatus, a magnet imposes a strong, uniform magnetic field on a body. After coils collect the magnetic induction signal, analogue amplifiers magnify the signal. Then, an analogue-to-digital converter digitizes the signal into digital raw data. A signal processor converts the digitized raw data into signal intensities, representing the nuclear magnetization in the x-y plane, and a display screen visually outputs the signal intensities as an image. Hence, an MRI scanner generates an image from raw data collected in a spatial-frequency domain (also called a k-space domain). Some of the k-space data is corrupted and therefore causes striation artifacts. With the present invention, there results a new corrected image essentially free of striation artifacts.

The present invention can be employed to restore images with striation artifacts including, but not limited to, magnitude images (images obtained from spin-echo, gradient-echo, or time-of-flight pulse sequences) and phase images (images obtained from phase-contrast pulse sequences). Moreover, the invention can be easily implemented on clinical and research MRI scanners with software or hardware in a manner which would be known to one skilled in the art, and it is computational efficient. In other words, the inventive correction method can be implemented as a one-touch, push-button procedure in a MR apparatus, and thus not require performance of a calculation by the operator of the MR apparatus. Furthermore, the invention can be integrated into the image reconstruction procedure. Therefore, corrupted data points can be detected and corrected during the image reconstruction process to avoid displaying images with striation artifacts.

As noted above, a very common clinical use of MRI is to generate an image from an area in a subject (usually a living human) in a clinical setting, followed by the image being analyzed/diagnosed to determine problems, if any, with the subject's tissue volume and/or blood flow. Especially in a clinical setting, MR data is typically generated with the use of 2D spin warp imaging, which employs a rectangular coordinate system, and the invention may be applied thereto. However, the invention is intended not only to apply to spin warp imaging, but also to apply to projection imaging, which employs a polar coordinate system. Applications to one-dimensional or multi-dimensional imaging are all possible.

More particularly, the spin warp imaging method is based on a 2D Cartesian coordinate system in the image domain, [x,y], and the corresponding k-space domain, $[k_x,k_y]$, and the inventive method may be used on a 2D Cartesian coordinate system. As discussed in detail below, the rectangular raw data for this embodiment of the invention were collected using the 2D spin-warp imaging method explained in the above-mentioned article entitled "Spin Warp NMR Imaging and Applications to Human Whole-Body Imaging" by Edelstein, Hutchinson, Johnson, and Redpath.

In an alternative embodiment, the inventive method is applied on an intermediate domain, $[x,k_y]$. The alternative embodiment also may be used on a polar-coordinate system, where the image domain, $[r,\theta]$, and the corresponding k-space domain, $[k_r,\theta]$, would be employed. The polar coordinate raw data may be collected using projection imaging methods as described in the above-mentioned article entitled "Image Formulation by Induced Local Interactions: Examples Employing Nuclear Magnetic Resonance" by Lauterbur.

Additionally, various image reconstruction algorithms to reconstruct an image from the raw data may be employed in these embodiments of the imaging method, and are explained in two of the above-mentioned articles, namely "Spatial Encoding and Image Reconstruction" by Riederer and "An Introduction to k-Space" by Peters.

For the present invention, the region, so that an image essentially free of striations can be generated, should be selected from an image domain of the body area or an intermediate domain (i.e., a domain between the image domain and the spatial-frequency domain) containing a homogenous material (for example, only one tissue or only random noise). By selecting a region containing a homogenous material, then for one embodiment, the magnitude of the expected value of the function describing the resultant image free of striation artifacts equals a constant on the magnitude image. Another embodiment on the intermediate domain will be described later on below.

Preferably, since in reality only a fraction of the image domain or of the intermediate domain contains a homogenous material, then a data window, such as a Hanning-window filter, is used on the image domain or on the intermediate domain to select a region containing a homogenous material. As noted above, Harris, "On the Use of Windows for Harmonic Analysis with the Discrete Fourier Transform", Proceedings of the IEEE, Vol. 66, No. 1 (January, 1978) affords a concise review of data windows and their effect on the detection of harmonic symbols in the presence of broad-band noise.

More specifically, the invention comprises the discovery of a method of using an analytical algorithm (for restoring the corrupted data points by corrected data points in the k-space raw data) which is applied to MRI signals and generates an MR image essentially free of striation artifacts, without the use of interpolation or the use of neighboring data points in the raw data. Suitably, the invention utilizes the available information treasured in a region containing a homogenous material, for the image domain of the striation-artifact image or for an intermediate domain thereof, from the body being imaged, including, but not limited to, a region selected from the group consisting of a background area (such as air, water, or gel) in the image domain, a homogenous tissue area in the image domain, an area containing mostly random noise in an intermediate domain (i.e., a domain between the image domain and the spatial-frequency domain), and a combination thereof. Next, the corrupted real components and the corrupted imaginary components of the corrupted data points in the k-space raw data are determined.

Furthermore, it is noted that generating a corrected second image may further include performing a correction process, to remove the striation artifacts that are on the first image, in a domain selected from the group consisting of the spatial-frequency domain, the image domain, the intermediate domain, and a combination thereof.

More particularly, the correction process may be performed in the spatial-frequency domain. As a result, the corrupted data points in the spatial-frequency raw data are corrected in the spatial-frequency domain, and the corrected second image essentially free of striation artifacts is generated from the corrected spatial-frequency raw data.

Also, the correction process may be performed in the image domain. As a result, the real and imaginary components of the corrupted data points in the spatial-frequency raw data are Fourier transformed to a corresponding image domain; and the corresponding image domain is added to the first image of the body area to produce a sum or is subtracted from the first image of the body area to produce a difference; and the corrected second image is generated from the sum or the difference, respectively.

Additionally, the correction process may be performed in the intermediate domain. As a result, the real and imaginary components of the corrupted data points in the spatial-frequency raw data are Fourier transformed to a corresponding intermediate domain; and the corresponding intermediate domain is added to the intermediate domain of the first image of the body area to produce a sum or is subtracted from the intermediate domain of the first image of the body area to produce a difference; and the corrected second image is generated by subjecting the sum or the difference, respectively, in the intermediate domain to a Fourier transform.

As further described below, one-dimensional and two-dimensional restoration methods were developed, and then, tested on the raw data collected from a human brain sample acquired on a MRI scanner. A striation-artifact-free image was first generated with original uncorrupted raw data for later comparison. Then, corrupted data points were artificially put on the k-space raw data. Afterwards, the two embodiments of the correction method were applied to restore the corrupted data points by corrected data points in the k-space raw data, and good-quality images were recovered, free of striation artifacts.

Below in section (a), the equations for generating MR images, using the spin-warp imaging method explained in the above-mentioned article entitled "Spin Warp NMR Imaging and Applications to Human Whole-Body Imaging" by Edelstein, Hutchinson, Johnson, and Redpath, are described. In section (b), the properties of the discrete Fourier transform, that was used to generate MR images, are discussed, which properties are important for the invention. Mathematical formulae for the corrupted raw data in k-space and the striation artifacts in images are explained in section (c). A 2D Fourier transform detection and correction method is presented in section (d), and a 1D Fourier transform detection and correction method is presented in section (e).

(a) *Two-dimensional raw data and image*

The two-dimensional spin-warp imaging method is commonly used for MR imaging, and the inventive Fourier transform detection and correction process is explained as follows with respect to the 2D spin-warp imaging method.

The complex (real and imaginary parts) raw data, $S[k_x, k_y]$, for the spin-warp imaging method are collected in a 2D, $[k_x, k_y]$ domain. It is the collective signal of magnetization in the x-y plane, represented by the function $M[x,y]$, described by:

$$S[k_x,k_y] = \iint M[x,y] e^{-i2\pi k_x x} e^{-i2\pi k_y y} dx\, dy \tag{1}$$

where $k_x$ and $k_y$ are the spatial frequencies along the x axis and the y axis, respectively. The $k_x$ and $k_y$ values are determined by the magnetic gradients' strengths and the time they are applied during imaging. Therefore, $M[x,y]$ can be reconstructed from the raw data using a 2D inverse Fourier transform given by:

$$M[X,Y] = \iint S[k_x,k_y] e^{+i2\pi k_x x} e^{+i2\pi k_y y} dk_x\, dk_y \tag{2}$$

The two functions, $S[k_x,k_y]$ and $M[x,y]$, are the corresponding functions for the data in the spatial-frequency domain (also known as the k-space domain) and in the image domain, respectively. Usually, only the magnitude of the image function, ||M[x,y]||, is used to display the image generated from the spin-echo, gradient-echo, and time-of-flight sequences, and only the phase of the image function, phase(M[x,y]), is used to display the image generated from the phase-contrast sequence.

In practice, the raw data are digitized numbers and a 2D discrete Fourier transform is used for generating images. In other words, a 2D DFT is employed to create an image from the digitized raw data.

More specifically, the relationship between the digitized $S[k_x,k_y]$ and $M[x,y]$ is that they are related by a 2D DFT as follows:

$$S[k_x,k_y]=DFT_{xy}\{M[x,y]\} \quad (3)$$

and $$M[x,y]=DFT_{xy}^{-1}\{S[k_x,k_y]\} \quad (4)$$

where $DFT_{xy}\{.\}$ and $DFT_{xy}^{-1}\{.\}$ represent the forward and inverse 2D DFT, respectively. Equations (3) and (4) are the digitized versions of equations (1) and (2), respectively.

Figure 2:
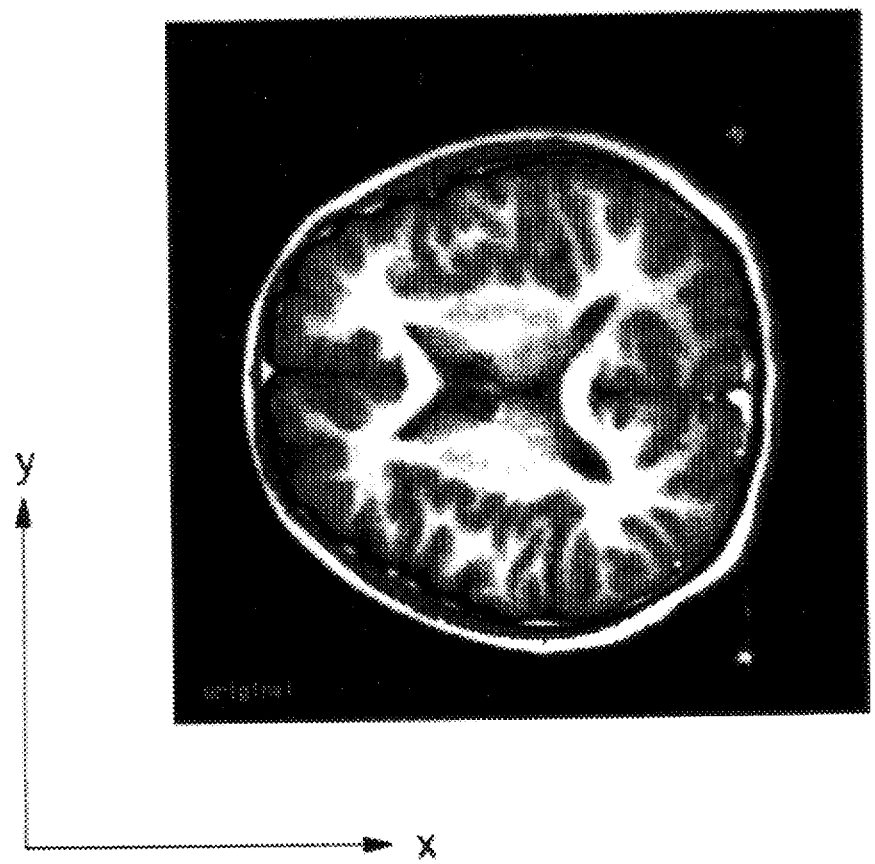
FIG. 2 illustrates the magnitude of a standard human brain image reconstructed from the k-space data shown in FIG. 1.

A set of complex raw data represented by the function, $S[k_x,k_y]$, for an axial section of the brain of a human head were collected for testing the inventive method. The k-space raw data were acquired using a spin-warp pulse sequence with a standard head coil on a 1.5 T scanner (SIGNA® brand from General Electric of Waukesha, Wis.). FIG. 1 shows the magnitude of the original raw data, $||S[k_x,k_y]||$. FIG. 2 shows the reconstructed, artifact-free magnitude image, $||M[x,y]||$, as a standard for later comparison. The matrix size for the raw data and image are both 256×256.

(b) Properties of DFT

Some properties of the DFT are essential to MR image reconstruction, as well as to the invention for restoring corrupted k-space raw data with corrected data. These properties are explained in conjunction with FIGS. 1 and 2, where the k-space domain and the image domain both have a matrix size of 256×256. The horizontal and vertical coordinates range from 0 to 255 at discrete steps of 1, as follows: the lower left corner is located at coordinates [0,0]; the lower right corner is located at coordinates [255,0]; the upper left corner is located at coordinates [0,255]; and the upper right corner is located at coordinates [255,255]. The units for [x,y] and [$k_x,k_y$] are omitted for the convenience of later discussion.

First of all, the origins of the two DFT domains are at [x,y]=[0,0] and [$k_x,k_y$]=[0,0], i.e., the lower left corner of the two domains. Secondly, the two DFT domains are periodical. Therefore, the low spatial-frequency area in the k-space domain and the low spatial-coordinate area in the image domain are located at the four corners of the two domains.

However, the k-space raw data represented by the function, $S[k_x,k_y]$, were collected with the low spatial-frequency data located at the middle of the 2D k-space domain (i.e., at [$k_x,k_y$]=[128,128]) as shown in FIG. 1. Moreover, the reconstructed brain image represented by the function, M[x,y], as shown in FIG. 2, was placed with its center at the middle of the image domain (i.e., at [x,y]=[128,128]), instead of at the four corners of the image domain. This phenomena leads to the third property of DFT, namely a phase-shift property.

The phase-shift property reveals that a position shift in one domain causes a phase shift in another domain, and conversely. Therefore, the position shift of the collected raw data in the k-space domain causes a phase shift in the reconstructed image. Because only the brain image from the magnitude of the image function is displayed in FIG. 2, the phase shift cannot be observed in FIG. 2. On the other hand, to move the center of the brain image from the four corners of the image domain to the middle of the image domain, a phase-shift is applied on the collected raw data. Again, this modulation cannot be seen on the raw data shown in FIG. 1; only the magnitude of raw data is displayed in FIG. 1.

The property that the four corners are the origins of the two domains can be employed for the method of the invention to restore corrupted raw data. In a later demonstration described below, the restoration method is applied to the four corners to recover the corrupted data points. However, the inventive restoration method is not limited to use on the four corners only; it also can be applied to any location containing a homogenous material.

(c) Corrupted raw data in the k-space domain and the striation artifacts in the image domain:

Assuming that there are n corrupted data points in the k-space raw data, then the raw data at locations [$p_\alpha$, $q_\alpha$] are altered by $a_\alpha \exp\{i\theta_\alpha\}$, for α=1, 2, ..., n. The corrupted raw data represented by the function, $S_{crpt}[k_x,k_y]$, can be expressed as:

$$S_{crpt}[k_x,k_y]=S[k_x,k_y]+\sum_{\alpha=1}^{\alpha=n}(a_\alpha e^{i\theta_\alpha})\delta[k_x-p_\alpha]\delta[k_y-q_\alpha] \quad (5)$$

where $$\delta[k_x-p_\alpha]=\begin{cases} 1, & k_x=p_\alpha \\ 0, & k_x \neq p_\alpha \end{cases} \quad (6)$$

$$\delta[k_y-q_\alpha]=\begin{cases} 1, & k_y=q_\alpha \\ 0, & k_y \neq q_\alpha \end{cases} \quad (7)$$

and $a_\alpha$, $\theta_\alpha$, $p_\alpha$, and $q_\alpha$ are the corresponding magnitude, phase, location at $k_x$ axis, and location at $k_y$ axis, respectively, for the $\alpha^{th}$ corrupted data point.

The striation-artifact image represented by the function, $M_{crpt}[x,y]$, is generated from the corrupted raw data represented by the function, $S_{crpt}[k_x,k_y]$, and is given by:

$$M_{crpt}[x,y]=DFT_{xy}^{-1}\{S_{crpt}[k_x,k_y]\}= \quad (8)$$

$$M[x,y]+\sum_{\alpha=1}^{\alpha=n}(a_\alpha e^{i\theta_\alpha})e^{+i2\pi(p_\alpha x+q_\alpha y)}$$

The striation artifacts are produced by the summation term at the second line of equation (8).

Figure 3:
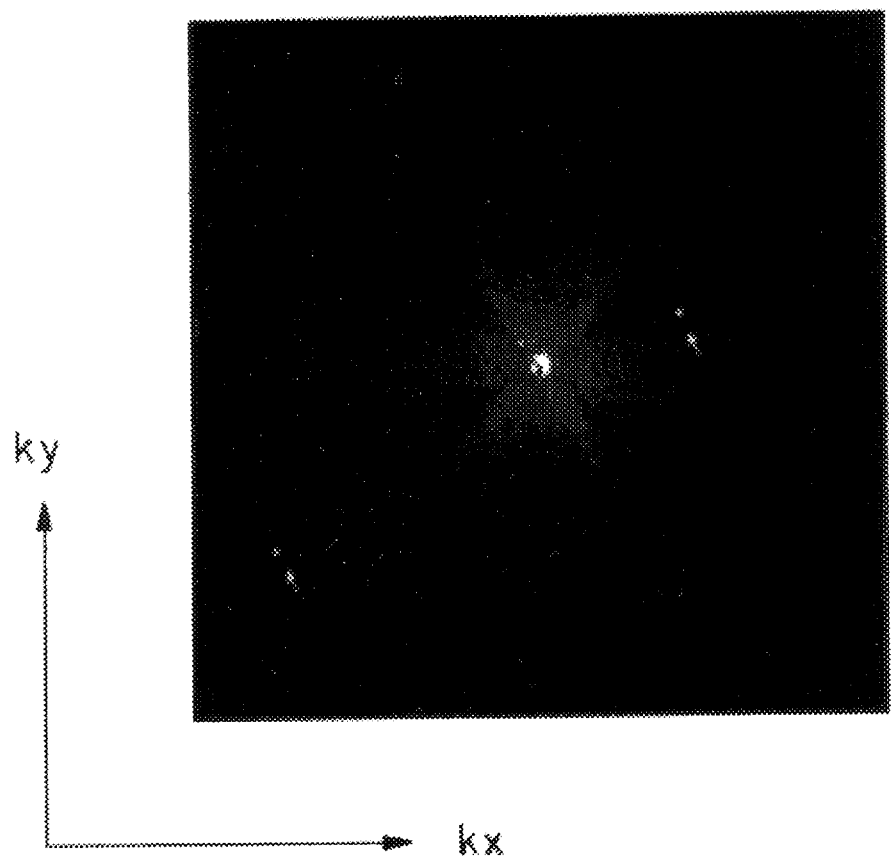
FIG. 3 illustrates three corrupted raw data points artificially placed on the raw data of FIG. 1, showing the magnitude of the corrupted raw data.
Figure 4:
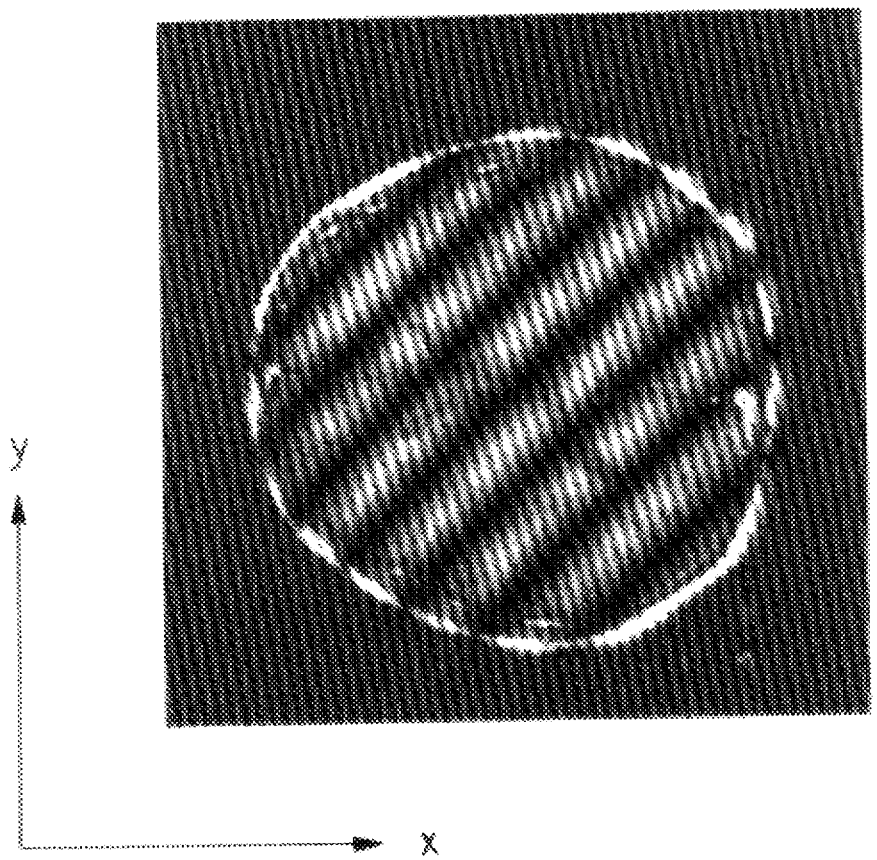
FIG. 4 illustrates the magnitude of the image reconstructed from the corrupted k-space raw data of FIG. 3, showing the striation artifacts caused by the three corrupted data points.

To test the 2D and 1D restoration methods that will be described in sections (d) and (e), three corrupted data points are artificially put into the original raw data represented by the function, $S[k_x,k_y]$. FIG. 3 shows the magnitude of the corrupted raw data function, $||S_{crpt}[k_x,k_y]||$, where the three arrows show the locations of corrupted data points. FIG. 4 shows the striation-artifact image obtained from the magnitude of the image function, $||M_{crpt}[x,y]||$, and is reconstructed from $S_{crpt}[k_x,k_y]$. The striation artifacts caused by the three corrupted data points can be clearly seen on the image shown in FIG. 4.

(d) Correction method in the [x,y] domain using 2D DFT

If a whole striation-artifact-free image represented by the function, M[x,y], is obtained from a region that contains only a homogenous material (for instance, only one tissue or only air), then $||M[x,y]||$ is a constant on the magnitude image. In particular, if the whole image is from a region that contains only air, then M[x,y]=0. A more precise description is that there is random noise on the image and the magnitude of the expected value for M[x,y] is a constant. Hence, it is assumed that the random noise is negligible, and thus M[x,y] may be described by:

$$M[x,y] = (a_0 e^{i\theta_0})e^{+i2\pi(p_0 x + q_0 y)} \quad (9)$$

for the simplicity of the following derivations. The $a_0$ term is the magnitude for the function representing the homogeneous-material image; the $\exp(i\theta_0)$ term is a fixed phase shift generated during signal detection; and the $\exp[+i2\pi(p_0 x \times q_0 y)]$ term is a location-dependent phase shift caused by the distance from the low spatial-frequency raw data relative to the origin of the k-space at $[k_x, k_y] = [0,0]$.

Therefore, the function for representing the image with striation artifacts can be described by substituting equation (9) into equation (8) as follows:

$$M_{crpt}[x,y] = \sum_{\alpha=0}^{\alpha=n} (a_\alpha e^{i\theta_\alpha})e^{+i2\pi(p_\alpha x + q_\alpha y)} \quad (10)$$

and a 2D forward DFT on this function representing the striation-artifact image of a homogenous material region described by equation (10) provides information about the corrupted data points because:

$$DFT_{xy}\{M_{crpt}[x,y]\} = \sum_{\alpha=0}^{\alpha=n} (a_\alpha e^{i\theta_\alpha})\delta[k_x - p_\alpha]\delta[k_y - q_\alpha] \quad (11)$$

However, usually only a fraction of an image contains a homogenous material. A 2D window filter (see the above-mentioned article entitled "On the Use of Windows for Harmonic Analysis with the Discrete Fourier Transform" by Harris), denoted as $\phi[x,y]$, can be used on the image domain to select a region containing a homogenous material for applying the 2D forward DFT.

The corrupted data points traced back from the filtered, homogenous material region are given by:

$$S_{trace-back}[k_x, k_y] = DFT_{xy}\{M_{crpt}[x,y]\phi[x,y]\} = \quad (12)$$

$$DFT_{xy}\left\{\left(\sum_{\alpha=0}^{\alpha=n}(a_\alpha e^{i\theta_\alpha})e^{+i2\pi(p_\alpha x + p_\alpha y)}\right)\phi[x,y]\right\} =$$

$$\left(\sum_{\alpha=0}^{\alpha=n}(a_\alpha e^{i\theta_\alpha})\delta[k_x - p_\alpha]\delta[k_y - q_\alpha]\right) * \Phi[k_x, k_y]$$

where $\Phi[k_x, k_y] = DFT_{xy}\{\phi[x,y]\}$, and "*" represents the convolution of two functions. Locations $[p_\alpha, q_\alpha]$ of the corrupted data points can be determined from the peaks in $\|S_{trace-back}[k_x, k_y]\|$. Furthermore, $a_\alpha$'s and $\theta_\alpha$'s can be calculated as:

$$a_\alpha = \frac{\|S_{trace-back}[p_\alpha, q_\alpha]\|}{\|\Phi[0,0]\|} \quad (13)$$

$$\theta_\alpha = \text{phase}(S_{trace-back}[p_\alpha, q_\alpha]) - \text{phase}(\Phi[0,0])$$

If the window filter is a symmetric function and it is applied at $[x,y]=[0,0]$ on the image domain, the phase of $\Phi[k_x, k_y]$ is zero, and $$Re(a_\alpha e^{i\theta_\alpha}) = \frac{Re(S_{trace-back}[p_\alpha, q_\alpha])}{\|\Phi[0,0]\|} \quad (14)$$

$$Im(a_\alpha e^{i\theta_\alpha}) = \frac{Im(S_{trace-back}[p_\alpha, q_\alpha])}{\|\Phi[0,0]\|}$$

Alternatively, one can simplify matters by using:

$$a_\alpha e^{i\theta_\alpha} = \frac{S_{trace-back}[p_\alpha, q_\alpha]}{\Phi[0,0]} \quad (15)$$

For example, a typical window filter, called a Hanning-window filter, located at "$[x,y]=[0,0]$" in the image domain, is described by:

$$\phi[x,y] = \begin{cases} \cos^2\left(\frac{\pi}{2} \frac{\sqrt{x^2+y^2}}{r}\right), & x^2+y^2 < r^2 \\ 0, & x^2+y^2 \geq r^2 \end{cases} \quad (16)$$

where r is the radius for the Hanning-window filter.

It is noted that if the 2D forward DFT is applied on the air background region (where $M[x,y]=0$), then the peak that would appear at location $[p_0, q_0]$ is avoided. The four corners on the image shown in FIG. 4 contain only air, and these areas are near $[x,y]=[0,0]$ in the image domain for applying the 2D forward DFT. Therefore, the Hanning-window filter described in equation (16) with a radius r=36 pixels is applied on the four corners to select a region for the 2D forward DFT computation.

Figure 5:
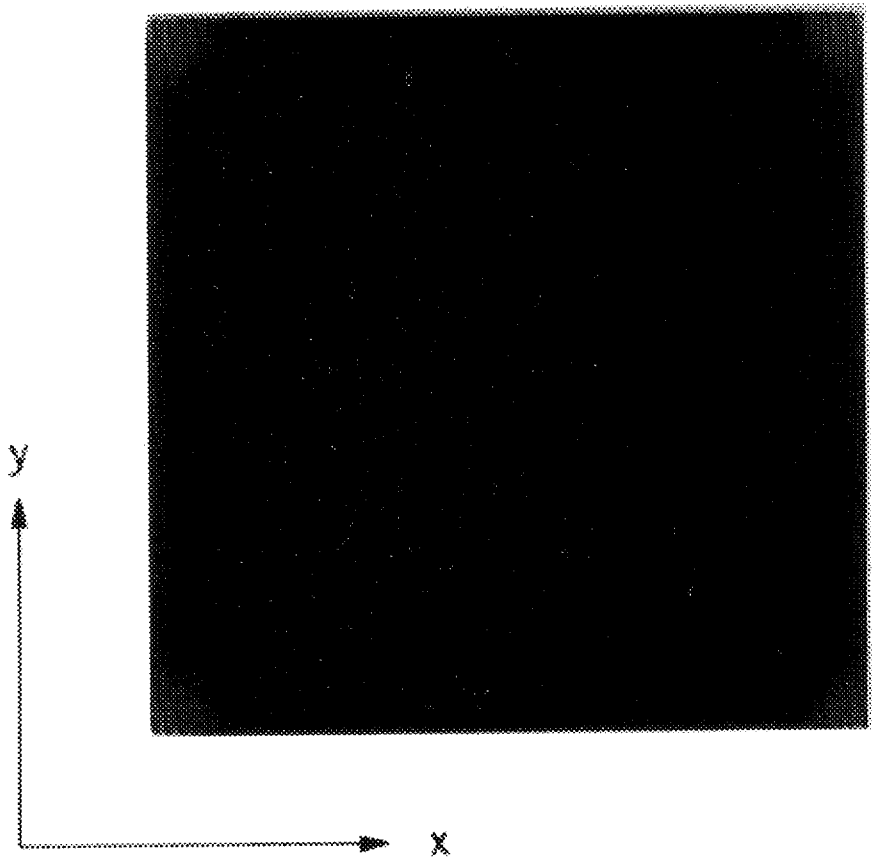
FIG. 5 illustrates the air-background region, selected from the image of FIG. 4, using a two-dimensional Hanning-window filter in the image domain.
Figure 6:
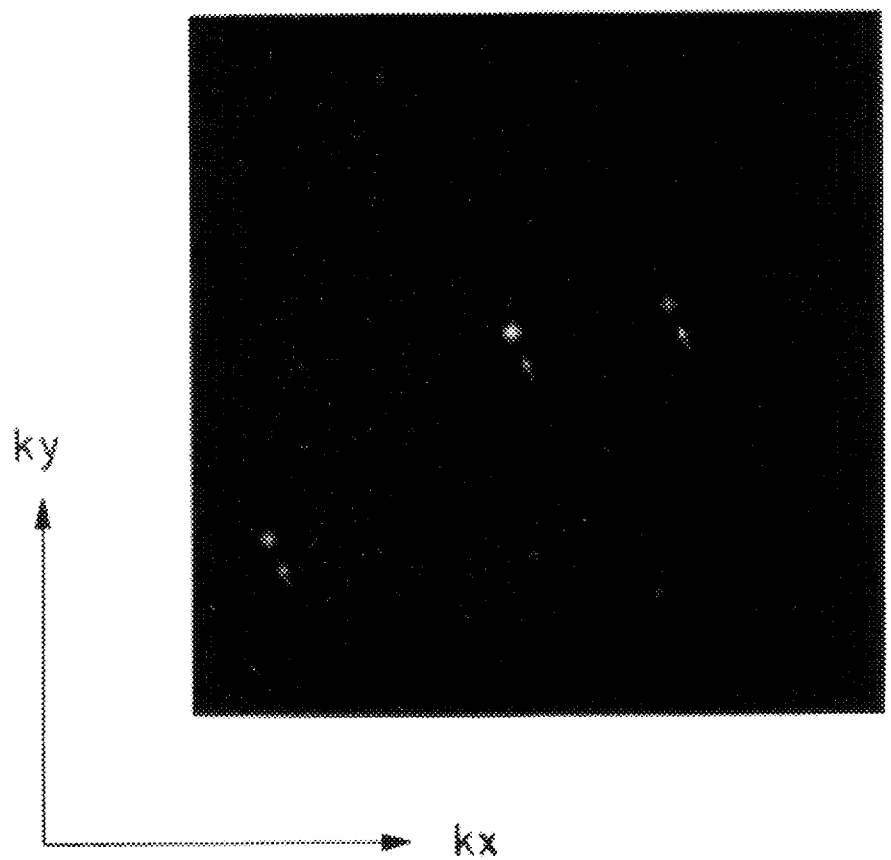
FIG. 6 illustrates three peaks corresponding to the corrupted data points in the k-space domain, calculated from the real and imaginary components of the image of FIG. 5 using a two-dimensional forward discrete Fourier transform.

FIG. 5 shows the air-background region selected from the image of FIG. 4 using the Hanning-window filter in the image domain. FIG. 6 shows the magnitude of the corresponding k-space domain, $\|S_{trace-back}[k_x, k_y]\|$, of this region calculated using the 2D forward DFT. In FIG. 6, three peaks corresponding to the corrupted data points can be clearly seen in the k-space domain.

Figure 7:
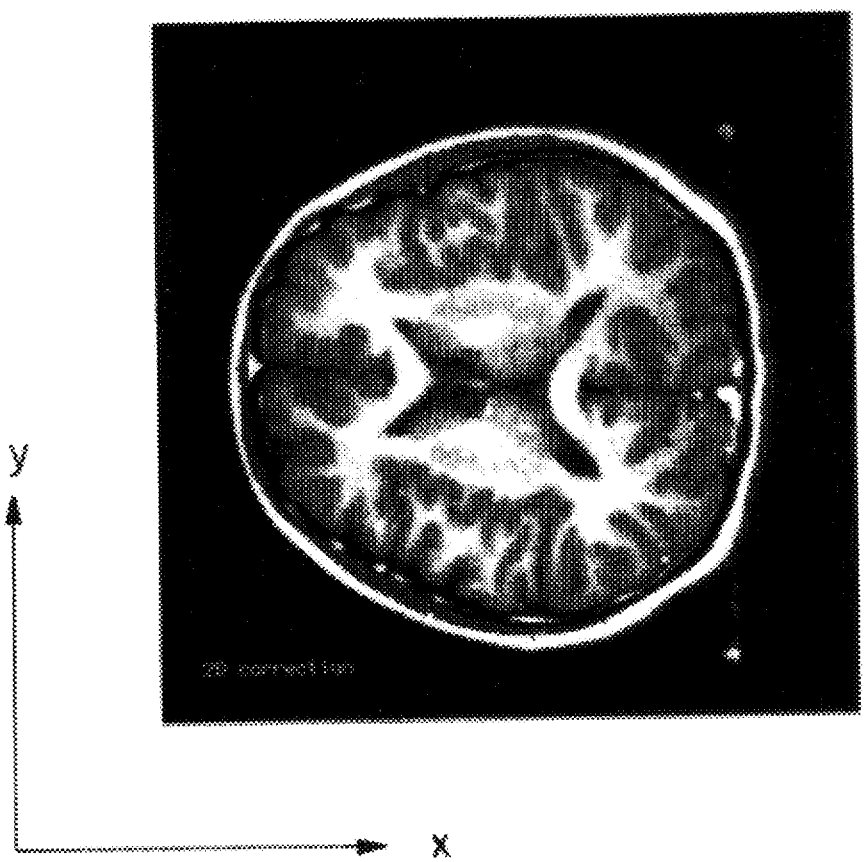
FIG. 7 illustrates the magnitude of the artifact-corrected image reconstructed from the corrupted k-space raw data of FIG. 3, after correcting the three corrupted data points.
Figure 8:
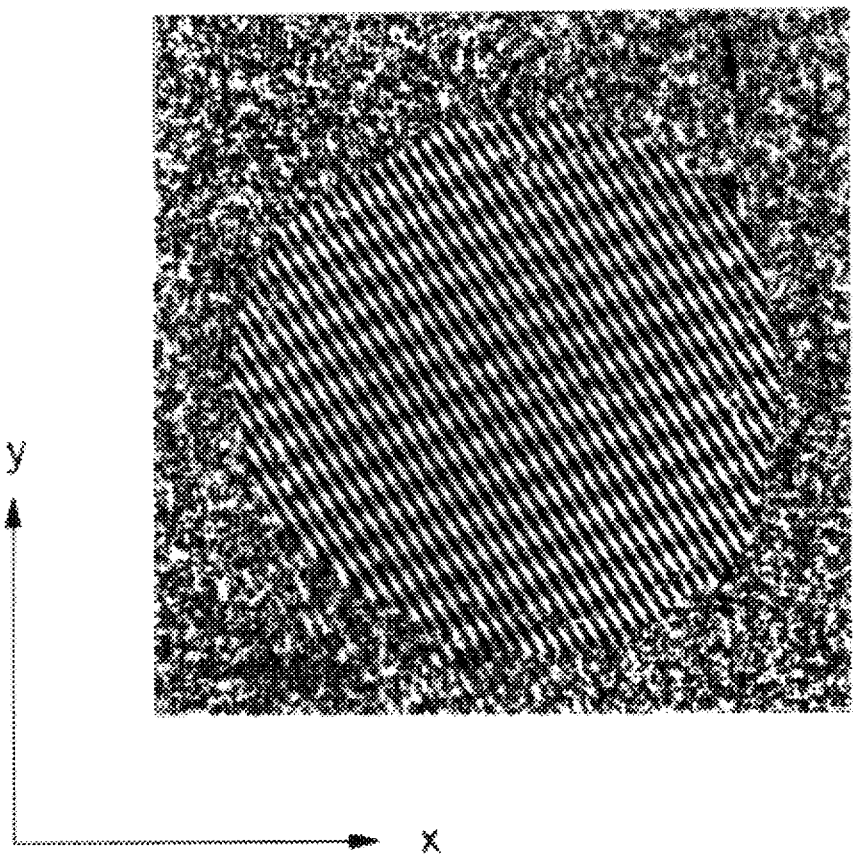
FIG. 8 illustrates the difference between the images in FIG. 2 and FIG. 7, namely the difference between the standard image and the artifact-corrected image, wherein the display level and the window were adjusted to show the difference.

After estimating the real and imaginary parts of the corrupted data points using equation (14), the corrupted raw data (with corrupted data points) are corrected and thus result from which a new image is generated. The artifact-corrected image is shown in FIG. 7. The display windows and the levels in FIGS. 2 and 7 are the same for comparison. FIG. 8 shows the difference between FIG. 2 and FIG. 7, that is, the difference between the standard image and the artifact-corrected image. In other words, the display window and level of FIG. 8 were modified to show the small signal intensity on the difference image.

The use of the window filter is not limited to its being located at $[x,y]=[0,0]$ in the image domain. Any region in the image domain containing a homogenous material is suitable for the correction algorithm.

(e) Correction method in the $[x, k_y]$ domain using 1D DFT

A 1D restoration method can be applied on an intermediate domain (in $[x, k_y]$ or $[k_x, y]$) of the spin-warp imaging method to detect the corrupted data points. Further-more, this 1D restoration method also can be used to restore corrupted data points in the polar k-space domain, $([k_r, \theta])$, wherein the raw data is collected using projection methods.

More particularly, the information in an intermediate domain (a domain between the image domain and the spatial-frequency domain), represented by the function $S[x, k_y]$, is generated by applying a 1D inverse discrete Fourier transform along the $k_x$ direction of $S[k_x, k_y]$ as described by:

$$S[x, k_y] = S[k_x, k_y]e^{+i2\pi k_x x}dk_x \quad (17)$$

and $$S[k_x, k_y] = S[x, k_y]e^{-i2\pi k_x x}dx \quad (18)$$

The digitized $S[x, k_y]$ and $S[k_x, k_y]$ are related by a 1D DFT as follows:

$$S[x, k_y] = DFT_x^{-1}\{S[k_x, k_y]\} \quad (19)$$

and $$S[k_x, k_y] = DFT_x\{S[x, k_y]\} \quad (20)$$

where $DFT_x\{.\}$ and $DFT_x^{-1}\{.\}$ represent the forward and inverse 1D DFT, respectively. Equations (19) and (20) are the digitized versions of equations (17) and (18), respectively.

The function representing corrupted data in the intermediate domain, $S_{crpt}[x,k_y]$, can be calculated from the corrupted raw data represented by the function, $S_{crpt}[k_x,k_y]$, described in equation (5), and thus is given by:

$$S_{crpt}[x, k_y] = DFT_x^{-1}\{S_{crpt}[k_x, k_y]\} = \qquad (21)$$

$$S[x, k_y] + \sum_{\alpha=1}^{\alpha=n} (a_\alpha e^{i\theta_\alpha}) e^{+i2\pi p_\alpha x} \delta[k_y - q_\alpha]$$

A 1D window filter can be applied at the region where the signal is smaller than that from random noise to trace back the corrupted data points in the $[k_x,k_y]$ domain using a 1D forward DFT. Here again, the random noise is assumed negligible, and "$S[x,k_y]=0$" is used (instead of using the magnitude of the expected value of $S[x,k_y]$ is equal to zero) for the simplicity of derivations. For example, a 1D Hanning-window filter centered at x=0 in the intermediate domain may be given by:

$$\phi[x] = \begin{cases} \cos^2\left(\dfrac{\pi}{2}\dfrac{x}{r}\right), & x < r \\ 0, & x \geq r \end{cases} \qquad (22)$$

The 1D forward DFT on the filtered data of this "$S[x,k_y]=0$" region is given by:

$$S_{trace-back}[k_x, k_y] = DFT_x\{S_{crpt}[x, k_y]\phi[x]\} = \qquad (23)$$

$$DFT_x\left\{\left(\sum_{\alpha=1}^{\alpha=n}(a_\alpha e^{i\theta_\alpha})e^{+i2\pi p_\alpha x}\delta[k_y-q_\alpha]\right)\phi[x]\right\} =$$

$$\left(\sum_{\alpha=1}^{\alpha=n}(a_\alpha e^{i\theta_\alpha})\delta[k_x-p_\alpha]\delta[k_y-q_\alpha]\right) * \Phi[k_x]$$

where $\Phi[k_x]=DFT_x\{\phi[x]\}$, and "*" represents the convolution of two functions. Therefore, $p_\alpha$ was determined from a peak observed at $k_y=q_\alpha$. The real components and imaginary components of the corrupted data points can be estimated using equation (13), (14), or (15).

Alternatively, $a_\alpha \exp(i\theta_\alpha)$ also can be estimated from the "$S[x,k_y]=0$" area in the intermediate domain as:

$$a_\alpha e^{i\theta_\alpha} = \frac{S_{trace-back}[x, k_y]}{e^{+i2\pi p_\alpha x}} \qquad (24)$$

for $k_y=q_\alpha$, when there is only one corrupted data point at $k_y=q_\alpha$.

Figure 9:
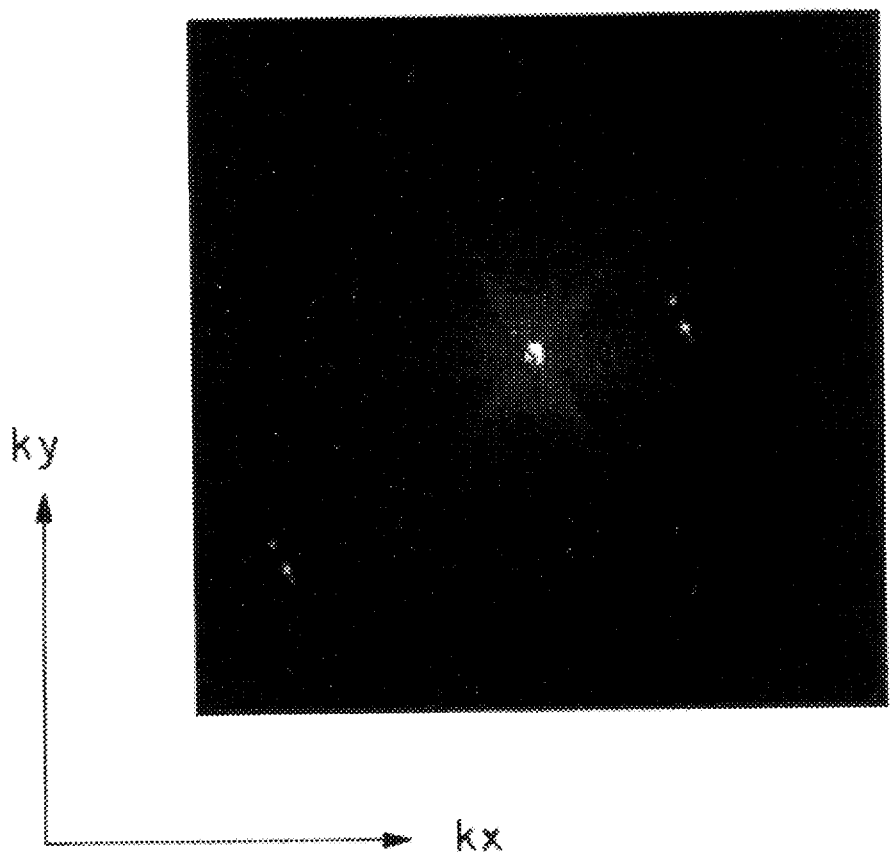
FIG. 9 illustrates the magnitude of the same corrupted raw data as shown in FIG. 3.
Figure 10:
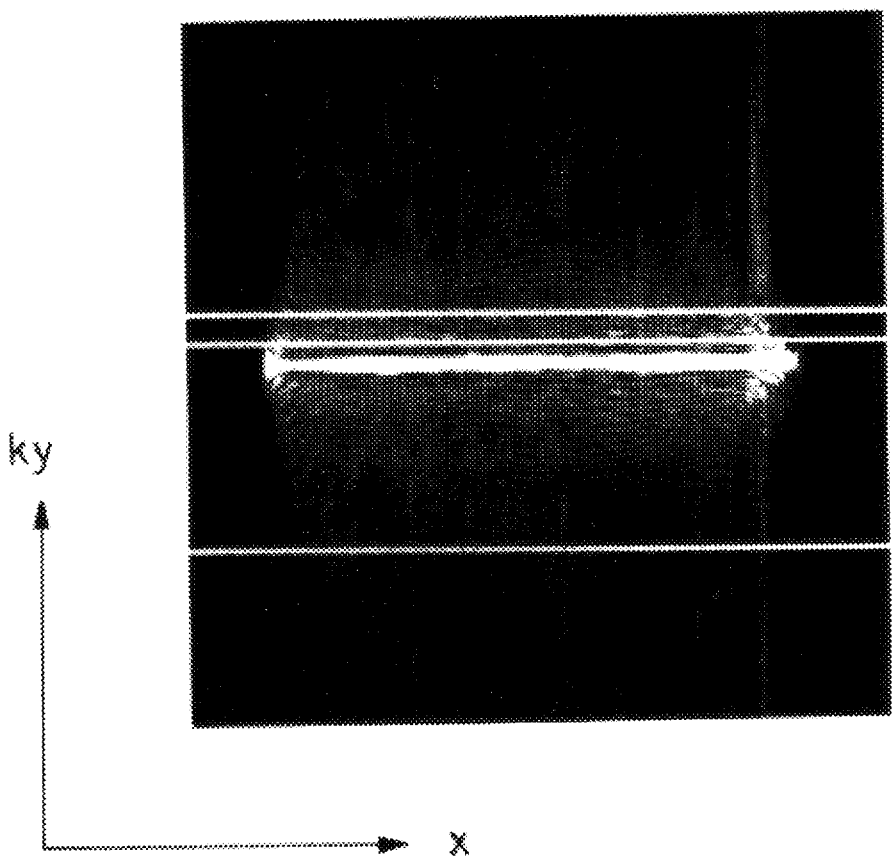
FIG. 10 illustrates the magnitude of the corrupted data of FIG. 9 in the intermediate domain ($[x,k_y]$).

FIG. 9 shows the magnitude of the same corrupted raw data, $\|S_{crpt}[k_x,k_y]\|$, as shown in FIG. 3. FIG. 10 shows the magnitude of the corrupted data in the intermediate domain, $\|S_{crpt}[x,k_y]\|$. The effects caused by the corrupted data points in k-space can be clearly seen at locations $k_y=q_\alpha$ in FIG. 10.

Figure 11:
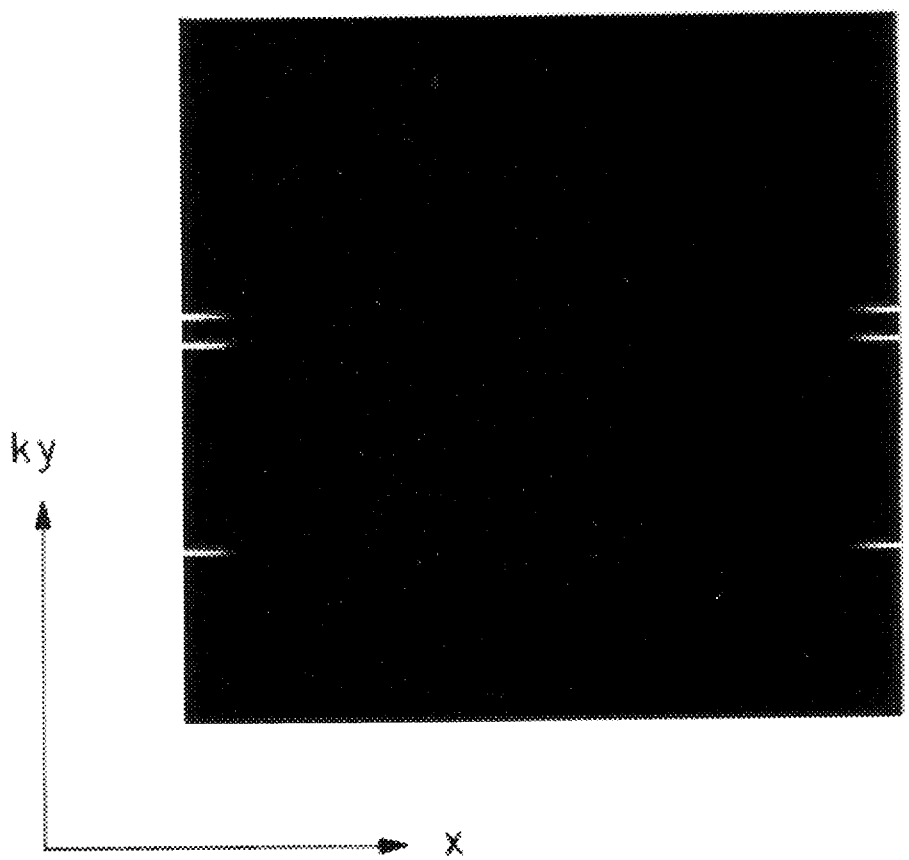
FIG. 11 illustrates the magnitude of selected random-noise region of FIG. 10, using a one-dimensional Hanning-window filter in the intermediate domain.
Figure 12:
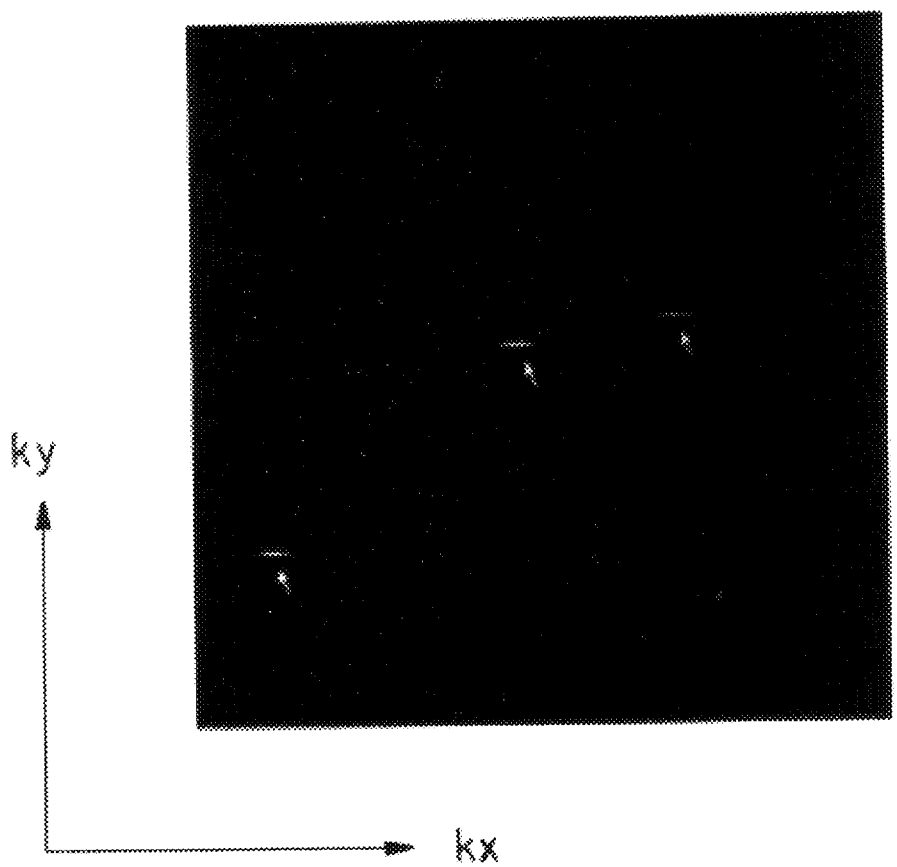
FIG. 12 shows the corresponding trace back from the real and imaginary components from FIG. 11 calculated using a one-dimensional forward discrete Fourier transform.

The left and right sides of $S_{crpt}[x,k_y]$ (as shown in FIG. 10) are the regions where "$S[x,k_y]=0$". These areas are near x=0 in the intermediate domain. Therefore, the Hanning-window filter described in equation (22) with a radius r=36 pixels was applied on $S_{crpt}[x,k_y]$ for the 1D forward DFT computation. FIG. 11 shows the "$S[x,k_y]=0$" regions selected using the Hanning-window filter in the intermediate domain. FIG. 12 illustrates the corresponding $\|S_{trace-back}[k_x, k_y]\|$ calculated using a 1D forward DFT. Three peaks corresponding to the corrupted data points can be clearly seen.

Figure 13:
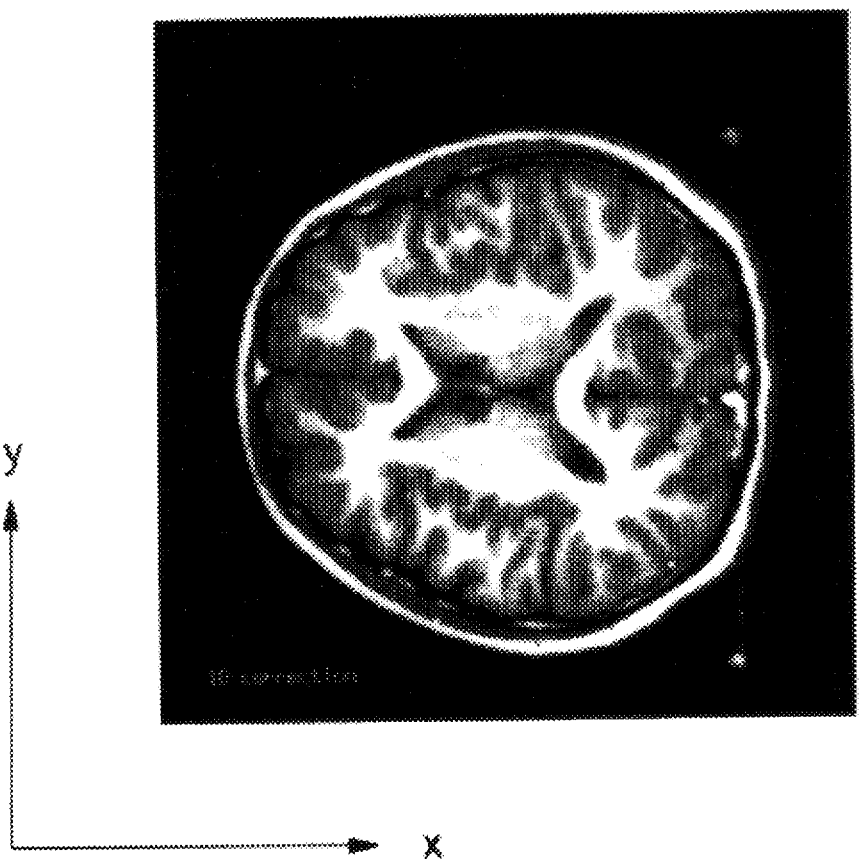
FIG. 13 illustrates the magnitude of the artifact-corrected image reconstructed from the corrupted raw data of FIG. 9, after correcting the three corrupted data points.
Figure 14:
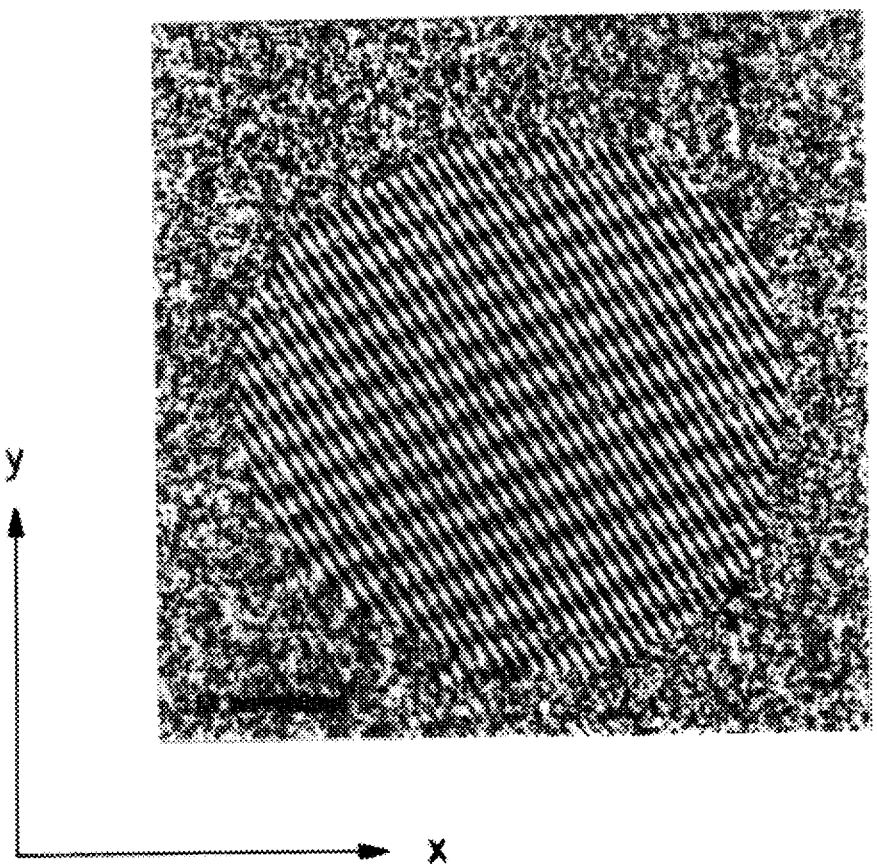
FIG. 14 illustrates the difference between the image of FIG. 2 and the image of FIG. 13, namely the difference between the standard image and the artifact-corrected image. The display level and the window are adjusted for showing the difference.

After estimating the real and imaginary parts of the corrupted data points using equation (14), the corrupted raw data represented by the function, $S_{crpt}[k_x,k_y]$, is corrected and thus corrected data points result from which a new image is generated. The artifact-corrected image is shown in FIG. 13. The display windows and the levels in FIGS. 2 and 13 are the same for comparison. FIG. 14 shows the difference between the image of FIG. 2 and of FIG. 13; that is, the difference between the standard image and the artifact-corrected image. Thus, the display window and level of FIG. 14 were modified to show the small signal intensity on the difference image.

This 1D restoration method can also be applied along the y-axis instead of the x-axis, and the information available in the $S[k_x,y]$ space can then be used to detect the corrupted data points. Furthermore, this 1D method can be applied sequentially along the x-axis, and then the y-axis, as well as in the polar $(r,\theta)$ coordinate system.

In conclusion, applicant's inventive MRI method for producing enhanced images essentially free of striation artifacts as described in detail hereinabove can be easily implemented on a General Electric SIGNA® brand MRI scanner (and other MRI machines) by modifications to the software and/or hardware thereof in a manner which would be known to one skilled in the art and which thus does not require further elaboration and/or detailed description herein.

Furthermore, it is noted that since the forward and inverse discrete Fourier transforms differ only by a minus sign in the exponent of the modulation functions, $\exp(\pm ik_x x)$, $\exp(\pm ik_y y)$, etc., the two transforms can be thought as right-hand-rotation and left-hand-rotation-modulations. Therefore, one can interchange the forward and inverse Fourier transforms described above and still can achieve the correction desired, namely an image essentially free of striation artifacts.

Lastly, it is noted that the present invention can be applied to zoomed images, as described in the two above-mentioned journal articles by Smith et al. and by Mitchell et al.

It will be understood that various details of the invention may be changed without departing from the scope of the invention. Furthermore, the foregoing description is for the purpose of illustration only, and not for the purpose of limitation—the invention being defined by the claims.

What is claimed is:

1. A method for correcting striation artifacts generated in a magnetic resonance imaging method comprising:

(A) generating by magnetic resonance imaging methodology and storing in a computer memory (i) complex raw data, having real components and imaginary components, and (ii) a first image of a selected body area, with the first image reconstructed from the raw data, the raw data being collected in a spatial-frequency domain of the first image of the body area, and the raw data including corrupted data points such that the first image has striation artifacts thereon;

(B) selecting a homogenous material region, having real components and imaginary components;

(C) communicating the real and imaginary components of the homogenous material region to the computer memory for correction;

(D) subjecting the real and imaginary components of the homogenous material region to a Fourier transform detection process, whereby the corrupted data points in the raw data are detected;

(E) communicating the detected corrupted data points to the computer memory and storing them therein; and (F) subjecting the detected corrupted data points to a Fourier transform correction process to remove striation artifacts, and generating from the computer memory a corrected second image essentially free of striation artifacts.

2. The method of claim 1, wherein in step (A), the spatial-frequency domain is related by a discrete Fourier transform to an image domain of the body area, and an intermediate domain is between the spatial-frequency domain and the image domain of the body area.

3. The method of claim 2, wherein step (B) further includes applying a data window to at least one of the image domain of the body area or the intermediate domain to choose the region containing a homogenous material.

4. The method of claim 2, wherein in step (B), the homogenous material region is selected from at least one of a background area in the image domain, a homogenous tissue area in the image domain, and an area containing random noise in the intermediate domain.

5. The method of claim 2, wherein generating a corrected second image in step (F) further includes performing the correction process, to remove the striation artifacts that are on the first image, in a domain selected from the group consisting of the spatial-frequency domain, the image domain, the intermediate domain, and a combination thereof.

6. The method of claim 5, wherein the correction process is performed in the spatial-frequency domain, such that the corrupted data points in the spatial-frequency raw data are corrected in the spatial-frequency domain, and the corrected second image essentially free of striation artifacts is generated from the corrected spatial-frequency raw data.

7. The method of claim 5, wherein the correction process is performed in the image domain, such that the real and imaginary components of the corrupted data points in the spatial-frequency raw data are Fourier transformed to a corresponding image domain, and the corresponding image domain is subjected to at least one of (i) the corresponding image domain is added to the first image of the body area to produce a sum and the corrected second image is generated from the sum and (ii) the corresponding image domain is subtracted from the first image of the body area to produce a difference, and the corrected second image is generated from the difference.

8. The method of claim 5, wherein the correction process is performed in the intermediate domain, such that the real and imaginary components of the corrupted data points in the spatial-frequency raw data are Fourier transformed to corresponding intermediate domain, and the corresponding intermediate domain is subjected to at least one of (i) the corresponding intermediate domain is added to the intermediate domain of the first image of the body area to produce a sum and the corrected second image is generated by subjecting the sum in the intermediate domain to a Fourier transform and (ii) the corresponding intermediate domain is subtracted from the intermediate domain of the first image of the body area to produce a difference and the corrected second image is generated by subjecting the difference in the intermediate domain to a Fourier transform.

9. The method of claim 1, wherein generating a first image in step (A) comprises generating a first image obtained from a pulse sequence selected from the group consisting of spin-echo, gradient-echo, time-of-flight, phase-contrast, and combinations thereof.

10. The method of claim 1, wherein in step (A) the raw data being collected and including the corrupted data points is accomplished with at least one of a rectangular coordinate system and a polar coordinate system for the first image.

11. The method of claim 10, wherein the rectangular coordinate system results from applying spin warp imaging.

12. The method of claim 10, wherein the polar coordinate system results from applying projection imaging.

13. The method of claim 1, wherein subjecting the real and imaginary components of the homogenous material region to a Fourier transform detection process in step (D) comprises subjecting the real and imaginary components to a Fourier transform detection process selected from the group consisting of a one-dimensional Fourier transform detection process, a two-dimensional Fourier transform detection process, a multi-dimensional Fourier transform detection process, and a combination thereof.

14. The method of claim 13, wherein the Fourier transform detection process is a two-dimensional Fourier transform detection process, and wherein:

step (B) further includes describing the homogenous material region for a striation-artifact-free image by, $$M[x,y] = (a_0 e^{i\theta_0}) e^{+i2\pi(p_0 x + q_0 y)}$$

wherein $$M[x,y] = (a_0 e^{i\theta_0}) e^{+i2\pi(p_0 x + q_0 y)}$$

has a magnitude that is a constant, and further includes describing the homogenous material region in the first image by, $$M_{crpt}[x,y] = \sum_{\alpha=0}^{\alpha=n} (a_\alpha e^{i\theta_\alpha}) e^{+i2\pi(p_\alpha x + q_\alpha y)}$$

and step (C) further includes communicating the real and imaginary components of the homogenous material region in the first image to the computer memory by applying $$DFT_{xy}\{M_{crpt}[x,y]\} = \sum_{\alpha=0}^{\alpha=n} (a_\alpha e^{i\theta_\alpha}) \delta[k_x - p_\alpha] \delta[k_y - q_\alpha]$$

to trace back the corrupted data points and to calculate real components and imaginary components of the corrupted data points in the spatial-frequency domain.

15. The method of claim 14, wherein in step (A), the spatial-frequency domain is related by a discrete Fourier transform to an image domain of the body area, and an intermediate domain is between the spatial-frequency domain and the image domain of the body area.

16. The method of claim 15, wherein (B) further includes applying a data window to at least one of the image domain of the body area or the intermediate domain to choose the area containing a homogenous material.

17. The method of claim 16, wherein:

step (B) further includes applying a data window comprising a window filter described by $$\phi[x,y] = \begin{cases} \cos^2\left(\frac{\pi}{2} \frac{\sqrt{x^2+y^2}}{r}\right), & x^2+y^2 < r^2 \\ 0, & x^2+y^2 \geq r^2 \end{cases}$$

to produce a windowed image therefrom; and step (D) further includes applying $$S_{trace-back}[k_x,k_y] = DFT_{xy}\{M_{crpt}[x,y]\phi[x,y]\} =$$

-continued $$DFT_{xy}\left\{\left(\sum_{\alpha=0}^{\alpha=n}(a_\alpha e^{i\theta_\alpha})e^{+2i\pi(p_\alpha x+p_\alpha y)}\right)\phi[x,y]\right\} =$$

$$\left(\sum_{\alpha=0}^{\alpha=n}(a_\alpha e^{i\theta_\alpha})\delta[k_x-p_\alpha]\delta[k_y-q_\alpha]\right) * \Phi[k_x,k_y]$$

to detect the corrupted data points using the windowed image.

18. The method of claim 13, wherein the Fourier transform detection process is a one-dimensional Fourier transform detection process, and wherein:

step (B) further includes describing the homogenous material region by $S[x,k_y]=0$ at a random noise area, and further includes describing the homogenous material in the intermediate domain of the first image by, $$S_{crpt}[x,k_y] = DFT_x^{-1}\{S_{crpt}[k_x,k_y]\} = S[x,k_y] + \sum_{\alpha=1}^{\alpha=n}(a_\alpha e^{i\theta_\alpha})e^{+2\pi p_\alpha x}\delta[k_y-q_\alpha]$$

and step (C) further includes communicating the real and imaginary components of the homogenous material region in the intermediate domain of the first image to the computer memory by applying $$DFT_x\{S_{crpt}[x,k_y]\} = \sum_{\alpha=1}^{\alpha=n}(a_\alpha e^{i\theta_\alpha})\delta[k_x-p_\alpha]\delta[k_y-q_\alpha]$$

to trace back the corrupted data points and to calculate real components and imaginary components of the corrupted data points in the spatial-frequency domain.

19. The method of claim 18, wherein in step (A), the spatial-frequency domain is related by a discrete Fourier transform to an image domain of the body area, and an intermediate domain is between the spatial-frequency domain and the image domain of the body area.

20. The method of claim 19, wherein step (B) further includes applying a data window to at least one of the image domain of the body area or the intermediate domain to choose the area containing a homogenous material.

21. The method of claim 20, wherein:

step (B) further includes applying a data window comprising a window filter described by $$\phi[x] = \begin{cases} \cos^2\left(\frac{\pi}{2}\frac{x}{r}\right), & x < r \\ 0, & x \geq r \end{cases}$$

to produce a windowed intermediate domain therefrom; and step (D) further includes applying $$S_{trace-back}[k_x,k_y] = DFT_x\{S_{crpt}[x,k_y]\phi[x]\} =$$

$$DFT_x\left\{\left(\sum_{\alpha=1}^{\alpha=n}(a_\alpha e^{i\theta_\alpha})e^{+2\pi p_\alpha x}\delta[k_y-q_\alpha]\right)\phi[x]\right\} =$$

$$\left(\sum_{\alpha=1}^{\alpha=n}(a_\alpha e^{i\theta_\alpha})\delta[k_x-p_\alpha]\delta[k_y-q_\alpha]\right) * \Phi[k_x]$$

to detect the corrupted data points using the windowed intermediate domain.

\* \* \* \* \*